United States Patent
Freissmann

(10) Patent No.: US 7,085,990 B2
(45) Date of Patent: Aug. 1, 2006

(54) PREPARATION OF DATA FOR A REED-SOLOMON DECODER

(75) Inventor: Lothar Freissmann, Niedereschach (DE)

(73) Assignee: Thomson Licensing, Boulogne-Billancourt (FR)

( * ) Notice: Subject to any disclaimer, the term of this patent is extended or adjusted under 35 U.S.C. 154(b) by 361 days.

(21) Appl. No.: 10/149,839

(22) PCT Filed: Dec. 12, 2000

(86) PCT No.: PCT/EP00/12552

§ 371 (c)(1),
(2), (4) Date: Jun. 14, 2002

(87) PCT Pub. No.: WO01/45271

PCT Pub. Date: Jun. 21, 2001

(65) Prior Publication Data

US 2002/0194569 A1    Dec. 19, 2002

(30) Foreign Application Priority Data

Dec. 15, 1999 (EP) .................................. 99125014

(51) Int. Cl.
*H03M 13/00* (2006.01)

(52) U.S. Cl. ...................................... 714/784; 714/776
(58) Field of Classification Search ................ 714/784, 714/752, 704, 776; 386/109, 116; 370/252, 370/468; 375/222
See application file for complete search history.

(56) References Cited

U.S. PATENT DOCUMENTS

| 5,610,983 | A | * | 3/1997 | Stewart ....................... 375/357 |
| 5,627,935 | A | * | 5/1997 | Kim ............................ 386/81 |
| 5,729,647 | A | * | 3/1998 | Kim ............................ 386/46 |
| 6,130,905 | A | * | 10/2000 | Wakayama ................. 375/132 |
| 6,175,944 | B1 | * | 1/2001 | Urbanke et al. ............ 714/776 |
| 6,445,733 | B1 | * | 9/2002 | Zuranski et al. ............ 375/231 |
| 6,594,794 | B1 | * | 7/2003 | De Marzi et al. ........... 714/784 |
| 6,757,861 | B1 | * | 6/2004 | Dong ........................ 714/761 |

OTHER PUBLICATIONS

H-C. Chang and C. Shung, "*A Reed-Solomon Product Code (RS-PC) Decoder for DVD Applications*", IEEE International Solid State Circuits Conference, US, IEEE Inc., Feb. 1998, XP000862225, New York, pp. 391, 392, & 470.
Search Report

* cited by examiner

*Primary Examiner*—Guy Lamarre
*Assistant Examiner*—Mujtaba K. Chaudry
(74) *Attorney, Agent, or Firm*—Joseph J. Laks; Ronald H. Kurdyla

(57) ABSTRACT

The present invention relates to a method and an arrangement for preparation of data for a Reed-Solomon decoder and more particularly to a method and an arrangement for an intelligent buffer in front of a ramless DVD Reed-Solomon decoder and further on particularly to a method and an arrangement for an intelligent buffer used also as a first pass correction storage of ECC-blocks. In such a way, the Reed-Solomon decoder will not get disordered ECC blocks by an intelligent buffer that leads to less necessary RAM and a high performance of the complete circuitry. The intelligent buffer is used as a first pass correction storage of the Reed Solomon decoder too.

23 Claims, 3 Drawing Sheets

FWDJ
addr_in > addr_out

FWDJ
addr_in < addr_out

BKWJ
addr_in > addr_out

BKWJ
addr_in < addr_out

PREPARATION OF DATA FOR A REED-SOLOMON DECODER

This application claims the benefit under 35 U.S.C. § 365 of International Application PCT/EP00/12552, filed Dec. 12, 2000, which claims the benefit of European Application No. 99125014.3, filed Dec. 15, 1999.

FIELD OF THE INVENTION

The present invention relates to a method and an arrangement for a preparation of data for a Reed-Solomon decoder and more particularly to a method and an arrangement for an intelligent buffer in front of a Reed-Solomon decoder that needs less RAM and ensures high performance.

BACKGROUND OF THE INVENTION

A conventional pre-processing buffer and Reed-Solomon use a common RAM to handle corrupted data. Such an arrangement and processing is for example used to correct data stored on an optical information media like a DVD for reproduction purposes. It is desirable to avoid to feed corrupted data to the Reed-Solomon decoder or to use a RAM to store the ECC block or to read defect parts several times what decreases the speed of the data path. DVD is an acronym for Digital Versatile Disc and ECC is an acronym for Error Correction Code—an electronic method of checking the integrity of data.

The data of the ECC is hierarchically organized in pieces of the data stream. The highest unit is an ECC-block that is divided into a number of sectors. Each sector is built up by a number of rows with a fixed length. To enable a correction of the stream a number of parity bytes are appended to each row; the number of the additional bytes determines the number of correctable faults per row. In addition to this facility of horizontal correction the same calculation is performed vertically over all bytes of an ECC-block which are at the same position of a row: the result is organized in additional rows of the ECC-block.

To control the order of sectors the first bytes contain identification information. The blocks in front of the buffer and Reed-Solomon part get the stream in frames two of which building a row: an identification of the frame order is evaluated and the result made available to the buffer by appropriate sync-signals.

A conventional arrangement stores the data into the common RAM with respect of the identification control results before the Reed-Solomon decoder starts to perform the correction of corrupted data bytes. Replacing the faulty data in memory would require processing overhead that could accumulate and significantly diminish system performance.

RAM is an acronym for Random Access Memory. It is a temporary storage area that the processor uses to execute programs and to hold data. Reed Solomon is a technique term for a forward error correcting code that is used to offset the effects of bit error in the receiving bit stream. Reed-Solomon codes are special and widely implemented because they are almost perfect in the sense that the extra redundant data added on by the encoder is at a minimum for any level of error correction so that no bits are wasted.

A Reed-Solomon decoder chip containing two frame buffer controllers that interface with two off-chip buffers, one of which is serving the incoming data has already been disclosed by IEEE International Solid-State Circuit Conference, US, IEEE Inc. (February 1998) XP862225.

SUMMARY OF THE INVENTION

It is an object of the invention to provide a method and an arrangement for a Reed-Solomon decoder that needs less RAM and ensures high performance by avoiding a replace of data in a memory which would require processing overhead that could accumulate and significantly diminish system performance.

The features mentioned in independent claims solve this problem. Dependent claims disclose preferred embodiments.

In accordance with an aspect of the invention a method and an arrangement for an intelligent buffer in front of a Reed-Solomon decoder as for example a DVD Reed-Solomon decoder are provided in which the data are analysed based on the incoming sync-signals and the data are buffered at appropriate buffer locations as long as the incoming ECC-block can be repaired by the Reed-Solomon decoder. In case that the ECC-block cannot be corrected the Reed-Solomon decoder gets a reset signal to cancel the first stage of processing. An address control block and a buffer form said intelligent buffer.

In case of a Reed Solomon decoder without RAM or a so-called ramless Reed Solomon according to the invention, the front-end circuit has no way to store a complete incoming ECC-block before sending it as a continuous data stream to the Reed-Solomon decoder. Without any precaution the Reed-Solomon decoder will get many disordered ECC-blocks which the decoder cannot correct. This leads to a poor performance of the complete circuitry.

The intelligent buffer of in front of the Reed-Solomon-decoder according to the invention tries to keep the organization of the data as far intact as possible and smoothes small defects; in the case that the defects will lead to corrupted data the Reed-Solomon block and the micro controller will be informed about the corrupted data. As the used ramless Reed-Solomon block has scalable parameters the Reed-Solomon buffer interface is also usable in other context. The classification of data and synchronization lacks will hold true for other block codes. A buffer is a little room for data storage. The buffer is placed between two units, which exchange data. The buffer's function give room for a temporary storage of the data coming from a unit in a situation where the other unit is not ready to receive the data. The buffer holds these data for a while and delivers them as soon as the recipient is ready to receive them.

In case of a DVD-player for example the data coming from the acquisition part must be buffered before they can be delivered to the Reed-Solomon correction block to compensate slight defects of the PLL. PLL is an abbreviation for phase locked loop. For this reason the acquisition part decodes the frame header and the sector identification from the incoming HF-signal and sends this information to the buffer part together with the data.

In such a way a buffer is in general necessary in front of the Reed Solomon decoder, which according to the invention is advantageously used.

The buffer block should be able to resynchronise the data stream at frame and sector boundaries to avoid that inappropriate frame length corrupts the Reed-Solomon. In case of not correctable jumps the buffer block stops the current first pass inner/outer correction of the Reed-Solomon decoder and resynchronises at the next ECC-block boundary. The Reed-Solomon-buffer interface must be reset in case of physical jumps.

In an enhanced embodiment an intelligent buffer is used for a first step Reed Solomon correction that deals with the rows of an ECC-block. Only some restrictions concerning the allowed jump area have to be respected. In such a way advantageously a ramless Reed-Solomon decoder that having a high performance and requires less RAM-memory is performed.

BRIEF DESCRIPTION OF THE DRAWINGS

The invention will now be described with reference to the accompanying drawings, in which.

DETAILED DESCRIPTION OF THE PREFERRED EMBODIMENTS

Figure 1:
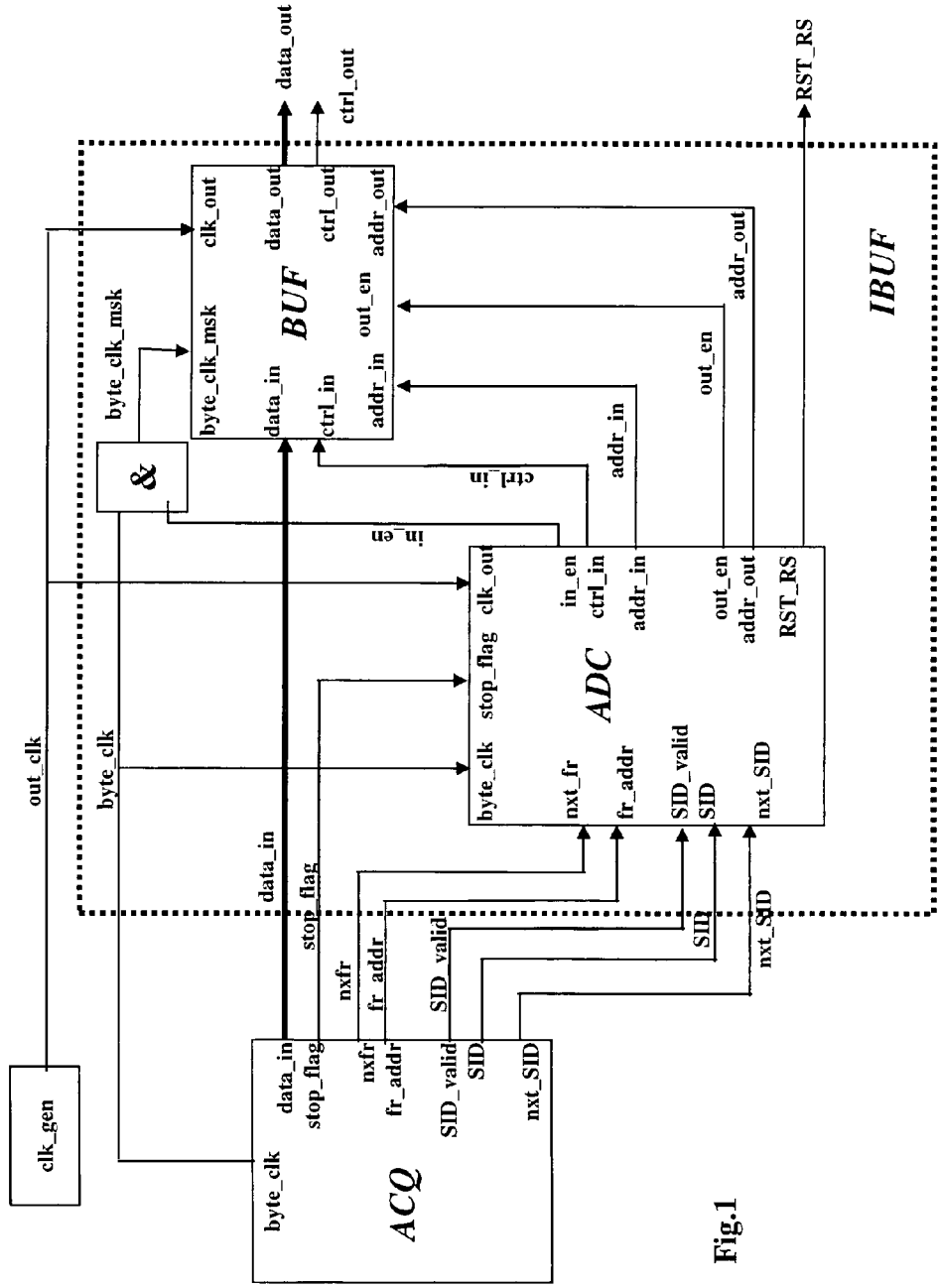
FIG. 1 is a block diagram for an intelligent buffer in front of a ramless DVD Reed-Solomon decoder together with some driving circuitry.

In FIG. 1 the three parts necessary to explain the function of an intelligent buffer IBUF in front of a not shown ramless Reed Solomon decoder are shown.

The first part is an acquisition block ACQ that provides a clock byte_clk of incoming data, the data at data line data_in and synchronizing information, the second part is an address control block ADC that creates addresses and control signals from the synchronisation signals provided from acquisition block ACQ; there are addresses for the in-going data stream at data line data_in and addresses and the control-out-signal ctrl_out for the outgoing data data_out sent from the buffer BUF to the Reed-Solomon decoder.

The third part is buffer BUF constructed as storage array with dual ports to handle independent time schemes for outgoing data data_out and incoming data on data line data_in. It may also be constructed with on IO-port if the input- and output-data streams are appropriate decoupled.

The address control block ADC and the buffer BUF form the so-called intelligent buffer IBUF according to the invention.

A further block shows a generator clk_gen to generate an independent clock out_clk used for the outgoing data data_out stream. This task represents a part of the not shown Reed-Solomon decoder.

As shown in FIG. 1, the generator clk_gen is connected to address control block ADC and buffer BUF for providing the independent clock out_clk, which is also used to read data from the buffer BUF to the not shown Reed Solomon block.

A further clock byte_clk of incoming data data_in is derived from the acquisition-block ACQ and applied to address control block ADC and via an AND-gate & to the buffer BUF. The other input of said AND-gate & is connected to an output of the address control block ADC providing an buffer-input-enable-signal in_en that enables the input of the buffer BUF via said AND-gate & by a masked byte clock signal byte_clk_msk formed by said AND-gate & and applied to a corresponding input of buffer BUF. A data line data_in connects a corresponding output of acquisition block ACQ with a corresponding input of buffer BUF and provides data as it is generated in the acquisition block and for entering into buffer BUF. Acquisition block ACQ and address control block ADC are furthermore connected for providing several signals for address control block ADC as there are a frame start signal nxfr, a frame address signal fr_addr that has been decoded by acquisition block ACQ, a sector identifier SID that also has been decoded by acquisition block ACQ, a next sector start signal nxt_SID, a valid sector identifier signal SID_valid indicating that the transferred sector identifier SID was decoded correctly by the acquisition block ACQ and a stop flag stop_flag for an asynchronous stop of operation requested by an internal micro controller in case of severe optical problems.

The address control block ADC is connected with buffer BUT and provides the buffer BUF with a control-in-signal ctrl_in comprising three bits signalling ECC-, sector- and frame-start of incoming data via data line data_in, a buffer in address signal addr_in for the in-going data, a buffer out address signal addr_out for outgoing data data_out and an output operation enable signal out_en for reading data data_out from the buffer BUF to the not shown Reed Solomon decoder. The address control block ADC provides furthermore a signal RST_RS that stops or resets the Reed Solomon decoder in case of illegal jumps.

The buffer BUF provides a control-out-signal ctrl_out comprising three bits signalling ECC-, sector- and frame-start of outgoing data data_out provided for the Reed Solomon decoder.

The acquisition block ACQ as shown in FIG. 1 represents the acquisition part of the channel circuit called as channel IC that has to extract the data and several control signals for synchronization.

From the bit stream coming for example from the optical part of a not shown DVD equipment this block decodes the data data_in, the byte clock byte_clk, the frame address fr_addr and sector number identified by sector identifier SID. In case of disorder in the frame numbers a fault-representing-sequence is substituted like in the present version of the acquisition part. A definite decoding of the sector identifier SID is classified by a valid sector identifier signal SID_valid equal to 1—pulse independently of the frame address decoding. This information is used to resynchronise the frame address to 0 even if the order was corrupted.

The address control block ADC as shown in FIG. 1 has to do the main work. Three stages are used for generating the addresses for the buffer BUF:

1rst Stage: Generating the expected frame address fr_addr and sector identifier SID. Following the synchronization signals from acquisition block ACQ the counters for the expected frame address fr_addr and for the sector identifier SID are set in address control block ADC and in cases of defects incremented independently on the current input. To follow the track of jumps also an internal expected ECC-counter is used, which in the ideal case should follow the incoming data's ECC blocks. This internal counter is incremented or decremented when the sector number crosses 0. If the acquisition block ACQ provides only an incomplete frame address fr_addr and a definite sector identifier SID and no ECC number, the most likely change in the expected address is assumed when jumps occur. If the full sector identifier SID is used the most significant bit can synchronise the ECC-counter too.

The rule how to handle jumps is:

In case of frame or sector disruptions do not jump a distance longer than half of the frame/sector-length from the current location The following cases are possible to evaluate the ratio of a current length to a norm length wherein n is an appropriately chosen integer:

A. 0) Frame length ok, i.e. length/norm length=1
  1) Frame length too long and n<length/norm length<=n-½
  2) Frame length too long and n+½<length/Norm length<=n+1
  3) Frame length too short and 0<length/norm length<=½
  4) Frame length too short and ½<length/norm length<1

B. 0) Frame address ok
  1) Frame address wrong

C. 0) Sector identifier SID ok
  1) Sector identifier SID too small, in the present ECC-block
  2) Sector identifier SID too small, in the next ECC-block
  3) Sector identifier SID too large, in the present ECC-block
  4) Sector identifier SID too large, in the previous ECC-block D. 0) Sector ok
  1) Sector too short
  2) Sector too long If the acquisition block ACQ could not find the frame address fr_addr in time it inserts one. If the next valid frame address is found during the first half frame length no frame address indicators are sent. This is why the different cases in A with a respect of ½ nominal length have been made. Some of these combinations cannot occur so that the number of combinations reduces a little bit.

2nd Stage: Generate the buffer-in-address signal addr_in for writing data into the buffer BUF.

Based on the expected addresses for an ECC-block, sector identifier SID and frame address fr_addr of the first stage a circular counter for the input address is incremented on the range of the buffer size. In case of jumps different strategies have to be performed depending on the direction of the jump, its size and the current address of the output stream as it will be described in detail below.

The process has to be able to perform a jump, to stop the input until an address is reached or to resynchronize the total process until a new ECC-block starts.

3rd Stage: Generate the output address for reading outgoing data data_out from the buffer BUF into the not shown Reed-Solomon decoder.

To ensure a proper addressing it is assumed that the independent output clock out_clk is faster than the input clock byte_clk. Input signals from data line data_in and outgoing data data_out form corresponding streams controlled by enable-signals and the output address addr_out follows the input address addr_in in some distance. In an embodiment a distance of half of the buffer size has been used.

At the begin and in case of resynchronization the output address corresponding to buffer out address signal addr_out is set to 0; in these cases and when the distance between input address addr_in and output address addr_out is less than the default distance the output address addr_out process waits until it is reached. If due to jumps the input address addr_in advances increasing the distance to the output address the addr_out is generated with full output clock out_clk speed until the default distance is reached again.

To handle jumps properly this process must be able to stop operation immediately or at a given address, to perform address generation by full speed and to resynchronize to 0 as it will be described below.

The buffer BUF as shown in FIG. 1 is a RAM of the specified size with dual ports so it can be asynchronously written and read or is alternatively constructed with one IO-port and a control logic preventing coincident in-and out-requests: this is necessary because the two clocks—clock byte_clk and clock out_clk—are completely independent from each other. Both, input and output, can be disabled to make the clock handling easier. When the sync-data are acquired in acquisition block ACQ and transferred to address control block ADC they must be transferred to the Reed Solomon block and the following RAM address generator block; therefore they must also be stored and sent synchronously with the outgoing data data_out.

The generator clk_gen is the generator of the independent clock out_clk for the outgoing data data_out which must have a higher frequency than the maximum frequency of the incoming data, i.e. the clock byte_clk. The generation of independent clock out_clk can be done by dividing the system clock used in the realization by a proper factor.

Jump Handling:

The address jumps listed above were sorted into categories with respect to the data section boundaries. To find out the best strategy for the buffer addressing a different classification than above has to be used because jumps have to be regarded under the aspect
  of the relation of the current in- and output buffer address,
  of the jump offset that means does the jump violate the integrity of the buffer data.
  of the amount of data sent in the meanwhile to the Reed-Solomon decoder dependent on the question whether the current ECC-block can be corrected anyway and
  how fast does a following synchronization occur.

Figure 2:
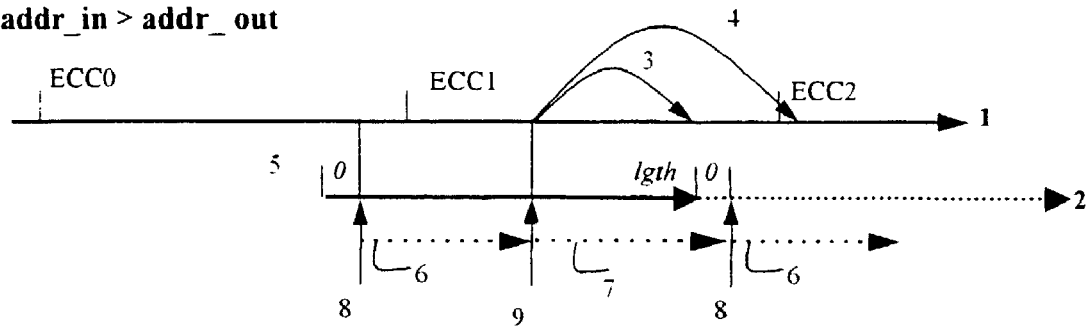
FIG. 2 is a schematic for forward jumps in case of addr_in>addr_out.
Figure 3:
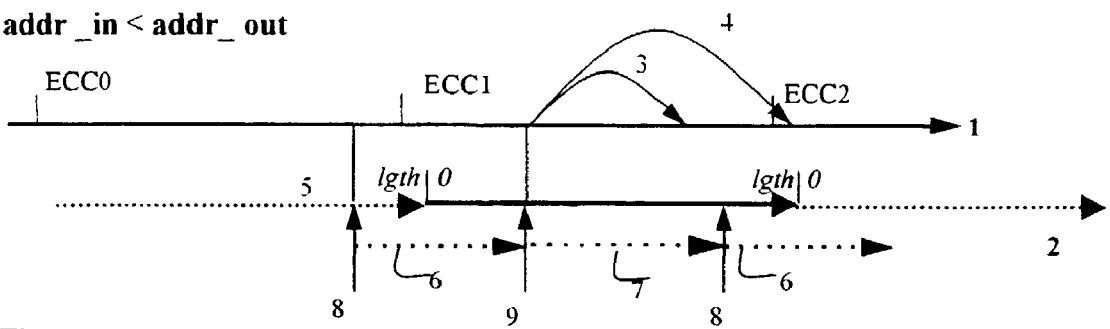
FIG. 3 is a schematic for forward jumps in case of addr_in<addr_out.
Figure 4:
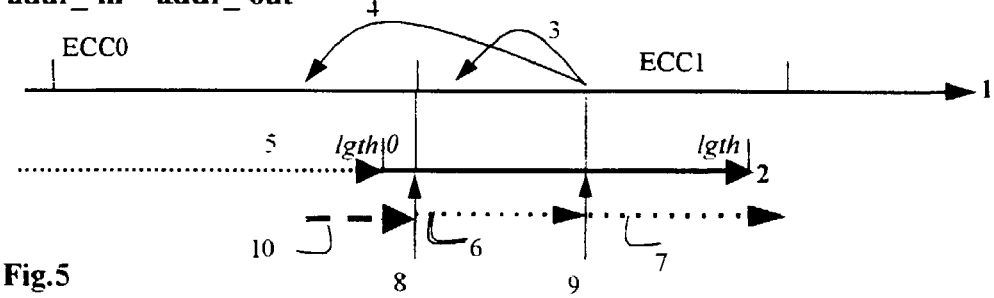
FIG. 4 is a schematic for backward jumps in case of addr_in>addr_out.
Figure 5:
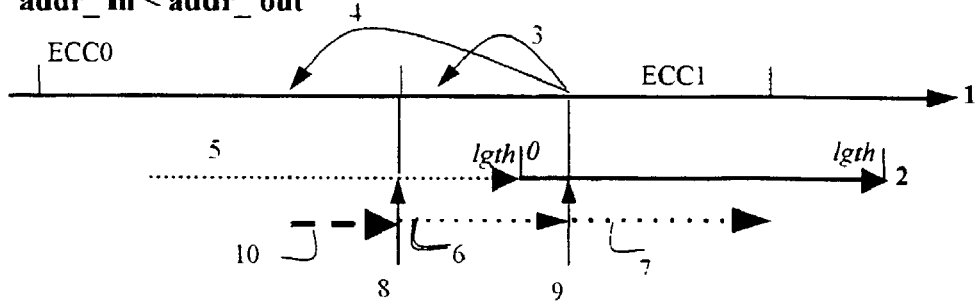
FIG. 5 is a schematic for backward jumps in case of addr_in>addr_out.

Forward jumps FWDJ are handled according to FIGS. 2 and 3 and backward jumps BKWJ according to FIGS. 4 and 5.

These figures show a data axis 1 with markers for ECC-boundaries ECC0, ECC1, ECC2 and parallel a buffer axis 2 with the start and end address noted in the area 5. Arrows show the buffer range under output 6 and the buffer part, which is free for input 7. Furthermore, a snapshot for the input address before a jump was requested 9 and the output address in nominal distance to the input address 8 are indicated.

FIGS. 2 and 3 illustrate the situation of a requested forward jump FWDJ under the circumstance that a buffer-in-address addr_in is higher than the buffer-out-address addr_out as shown in FIG. 2 and under the circumstance that a buffer-in-address addr_in is lower than the buffer-out-address addr_out as shown in FIG. 3. The requested first jump 3 will target to an area, which will not hurt the above-mentioned integrity of the stored data in contrast to a second jump 4 which is longer than the first one. The latter case will therefore not be performed but the output must be accelerated until the next requested address is out of the forbidden range 6 or the complete ECC-block must be dropped. The decision depends on the progress in completing the ECC-block and on the jump distance.

FIGS. 4 and 5 show the configuration of backward jump BKWJ requests under the circumstances that an buffer-in-address addr_in is higher than the buffer-out-address addr_out as shown in FIG. 4 and under the circumstance that an buffer-in-address addr_in is lower than the buffer-out-address addr_out as shown in FIG. 5. The shorter first jump 3 points to the allowed range and can continue the input but must stop the output until the distance between input- and output-address is the nominal distance. In case of a longer second jump 4 the requested next input address of the buffer-in-address signal addr_in points to an area that is not yet sent out from the buffer BUF; assuming that the last data were corrupted the output is stopped and the area of output data overwritten. A different strategy is to stop the input and output of the buffer BUF until the input-address of buffer in address signal addr_in points to an allowed area. In both strategies the possibly corrupted data 10 are already sent out.

Figure 6:
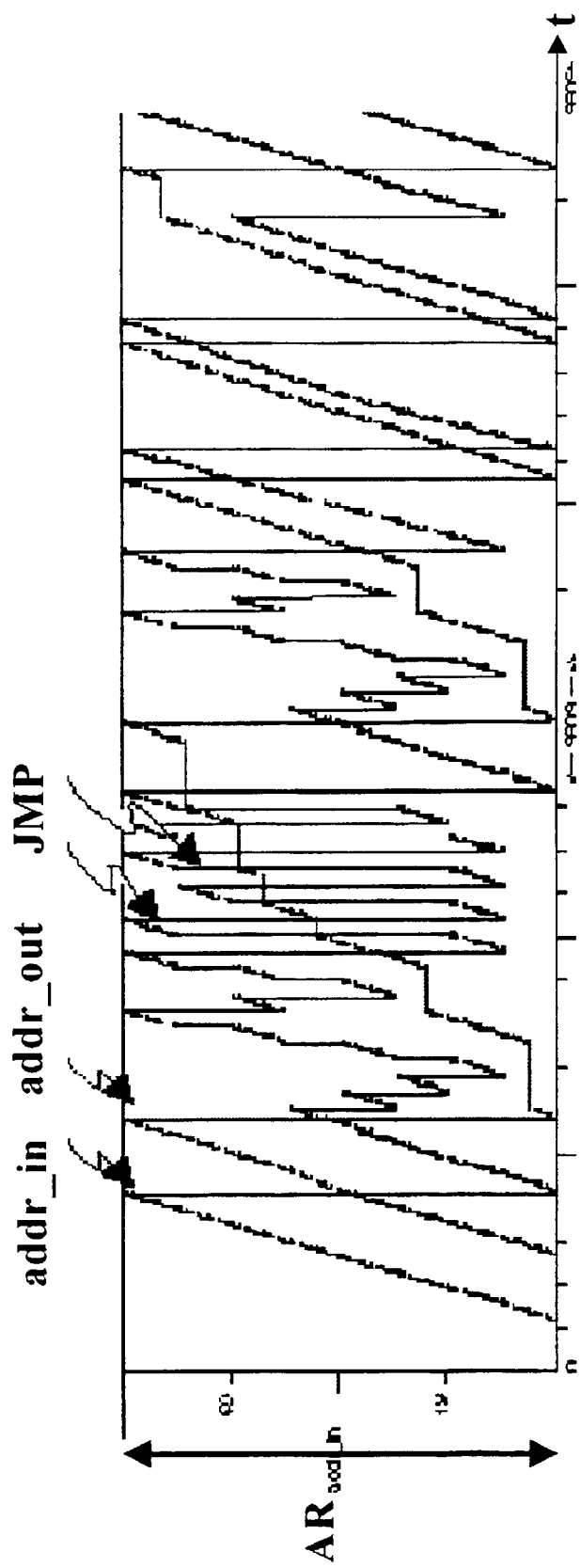
FIG. 6 shows input- and output-address of the buffer in case of jumps in sector ID.

FIG. 6 illustrates the behaviour of the embodiment for several jumps in the input and the behaviour of the output addresses. It demonstrates that most of the jumps are smoothed out.

FIG. 6 shows an address range AR of the buffer BUF over a time axis t. The input address of the buffer in address signal addr_in causes an output address of the buffer out address signal addr_out following in some distance in spite of jumps like JMP which is evidently smoothed.

In case of physical jumps no usage of the currently read sectors will be made. In this case a stop flag stop_flag is activated as shown in FIG. 1. This is independent whether or not the currently read sectors have been completed or not. The address-processes will be restarted completely in such a case and a signal RST_RS is generated to reset the Reed Solomon operation.

In a second not shown embodiment the buffer BUF is used simultaneously as correction buffer for the first step of the Reed Solomon decoder. The only difference to the previously described embodiment is a more restricted range for jumps because one has to take into account that the single output address of the buffer-out-address signal addr_out of the first embodiment is split into three addresses dedicated to the calculation and performing of the first step inner correction of a Reed-Solomon decoder using the stored data in the buffer BUF the calculation of syndromes of the first outer correction and the output of the data corrected in inner mode.

The terms inner and outer correction are related to the known correction modes inside a Reed Solomon decoder.

Decisions made in the previous embodiment on the output address of the buffer-out-address signal addr_out have therefore to be done now on the most limiting of these addresses. The implementation needs a more restrictive time scheme depending on the needs of the Reed Solomon decoder.

In such a way, the Reed-Solomon decoder will not get disordered ECC blocks by an intelligent buffer IBUF that leads to less necessary RAM and a high performance of the complete circuitry. The intelligent buffer IBUF according to this embodiment is used as a first pass correction storage of the Reed Solomon decoder too.

The method and arrangement described here are given as examples only and a person skilled in the art may realise other embodiments of the invention while remaining in the scope of the invention. The intelligent buffer IBUF according to the invention is particularly advantageous in that it may easily be used for various kinds of error correction systems.

What is claimed is:

1. An apparatus for preparation of data for a Reed-Solomon decoder comprising:
   a buffer in front of a following Reed-Solomon decoder in which received data are analyzed concerning at least one of frame length, order of frames and order of sectors of said data as to whether or not said data can be repaired by the Reed Solomon decoder, and
   an address control means connected to said buffer for providing address and control signals for said buffer, which avoid at least one of an inappropriate frame length and the order of data corrupting the Reed-Solomon decoding.

2. Apparatus according to claim 1, wherein
   said buffer is connected via a data line to an acquisition block as well as an address control block for evaluating frame address signals and sector identifier concerning an integrity with an ECC block length.

3. Apparatus according to claim 1, wherein
   said buffer is controlled by an independent clock having a higher frequency than a maximum frequency of incoming data at a data line supplied to the buffer.

4. Apparatus according to claim 1, wherein
   said buffer is a storage medium used in front of a Reed Solomon decoder of a DVD-player.

5. Apparatus according to claim 1, wherein
   said buffer can stop a current first pass inner/outer correction of the Reed Solomon decoder and resynchronizes at the next ECC block boundary.

6. Apparatus according to claim 1, wherein
   said buffer is used for a first step Reed Solomon correction that deals with the rows of an ECC-block.

7. Apparatus according to claim 1, wherein
   said buffer is constructed as storage array with dual ports to handle independent time schemes for outgoing data and incoming data on data line so it can be asynchronously written and read or is alternatively constructed with one IO-port and a control logic preventing coincident in- and out-requests.

8. Apparatus according to claim 2, wherein
   a clock of incoming data is derived from the acquisition-block and applied to address control block and via an AND-gate that is also supplied by a buffer-input-enable-signal provided by the address control block to the buffer.

9. Apparatus according to claim 2, wherein
   counters for an expected frame address and for sector identifier follow the synchronization signals from the acquisition block and in cases of defects were incremented or decremented independently of the current input.

10. A method for preparation of data for a Reed-Solomon decoder comprising:
    buffering incoming ECC-block organized data at ECC-row depending addresses according to frame information of the dataflow in a buffer as long as, due to at least one of frame length and order of frames and order of sectors of said data, an incoming ECC-block can be repaired by the Reed Solomon decoder to avoid an inappropriate frame length or order of data corrupting the Reed-Solomon decoding; and
    resynchronizing data at the next ECC-block boundary in case the Reed-Solomon decoder is not able to correct a data block.

11. A method according to claim 10, wherein,
    data are buffered at row depending addresses based on the order decoded from the incoming sync-signals by an address control block in a buffer which provides the addresses as long as the Reed-Solomon decoder is able to repair an incoming ECC-block and which in a case that the ECC-block cannot be corrected provides a reset signal to cancel the first process stage of processing said ECC-block.

12. A method according to claim 11, wherein said data are analyzed concerning frame address, sector identifier and ECC-block number decoded by an acquisition block and where a jump or the most likely change in the expected addresses is assumed when only an incomplete frame address and a definite sector identifier and no ECC-block number have been detected.

13. A method according to claim 12, wherein
if the full sector identifier is available the most significant bits of a sector identifier are used to synchronize an internal counter within said address control block.

14. A method according to claim 10, wherein
jumps of successive data in case of frame or sector dsruptions do not influence the integrity of ECC-blocks if a distance is not longer than a predetermined distance.

15. A method according to claim 14, wherein
said distance is not longer than half of the length of the free buffer.

16. A method according to claim 14, wherein
no frame address indicators are provided if a next valid frame address is found during the first half frame length.

17. A method according to claim 14, wherein
a circular counter for input address in an address control block is incremented/decremented on the range of the buffer size of a buffer based on the expected addresses for an ECC- block, a sector identifier and a frame address.

18. A method according to claim 14, wherein
at the beginning and in case of resynchronization the output address corresponding to a buffer out address signal is set to zero and in these cases and when the distance between input address and output address is less than a default distance the output address process waits until it is reached and if due to jumps of the input address increasing the distance, output addresses are generated with full output clock speed until the default distance is reached again.

19. A method according to claim 14, wherein
in case of a forward jump if a jump targets to the unblocked area of the buffer of length the new storage does not hurt the integrity of already stored data and if in contrast a jump into the blocked storage area of the buffer of length is requested the jump will not be performed but the output is accelerated until the next requested input address is out of a forbidden range.

20. A method according to claim 14, wherein
in case of a backward jump if a jump targets to the unblocked area of the buffer of length the new storage will not hurt the integrity of stored data and the input can continue but must stop the output until the distance between input- and output-address is the nominal distance and if in contrast a jump into a blocked storage area of the buffer of length is requested the input address of the buffer-in-address signal is updated but the data is not stored until the buffer-in-address signal points to an allowed buffer area.

21. A method according to claim 10, wherein
in case of physical jumps of a pickup of a player no usage of currently read sectors is made, a stop flag is activated independent whether or not currently read sectors have been completed or not, the address-processes are restarted completely and a signal is generated to reset the Reed Solomon operation.

22. A method according to claim 10 comprising the steps of:
generating an expected frame address and sector identifier, generating a buffer in address signal for writing data in a buffer based on the expected addresses for an ECC-block, sector identifier and frame address, generating the output address for reading outgoing data from said buffer into the Reed-Solomon decoder.

23. A method according to claim 22, wherein
a single output address of a buffer out address signal of said buffer is extended to three addresses dedicated to:
a calculation and a performing of a first step inner correction of a Reed-Solomon decoder using stored data in the buffer,
a calculation of syndromes of a first outer correction and an output of data corrected in said inner correction.

* * * * *